(12) United States Patent
Goshonoo et al.

(10) Patent No.: US 8,716,047 B2
(45) Date of Patent: May 6, 2014

(54) METHOD FOR PRODUCING TRANSPARENT CONDUCTIVE LAYER COMPRISING TIO2 AND METHOD FOR PRODUCING SEMICONDUCTOR LIGHT-EMITTING ELEMENT UTILIZING SAID METHOD FOR PRODUCING TRANSPARENT CONDUCTIVE LAYER

(75) Inventors: Koichi Goshonoo, Aichi-ken (JP); Miki Moriyama, Aichi-ken (JP); Taro Hitosugi, Aichi-ken (JP); Tetsuya Hasegawa, Aichi-ken (JP); Junpei Kasai, Aichi-ken (JP)

(73) Assignees: Toyoda Gosei Co., Ltd., Kiyosu-Shi, Aichi-Ken (JP); Kanagawa Academy of Science and Technology, Kawasaki-Shi, Kanagawa (JP)

( * ) Notice: Subject to any disclaimer, the term of this patent is extended or adjusted under 35 U.S.C. 154(b) by 0 days.

(21) Appl. No.: 12/585,015

(22) Filed: Aug. 31, 2009

(65) Prior Publication Data

US 2010/0062558 A1    Mar. 11, 2010

(30) Foreign Application Priority Data

Sep. 1, 2008    (JP) ................................ 2008-223631

(51) Int. Cl.
*H01L 21/00* (2006.01)
*H01L 21/44* (2006.01)

(52) U.S. Cl.
USPC ....... 438/46; 438/604; 438/609; 257/E21.159

(58) Field of Classification Search
USPC ............. 438/46, 604, 608, 609; 257/E21.159
See application file for complete search history.

(56) References Cited

U.S. PATENT DOCUMENTS

| | | | | |
|---|---|---|---|---|
| 6,468,402 | B1 * | 10/2002 | Vanderstraeten | 204/192.15 |
| 2002/0132454 | A1 * | 9/2002 | Ohtsu et al. | 438/486 |
| 2004/0053478 | A1 * | 3/2004 | Moustakas | 438/479 |
| 2004/0094801 | A1 | 5/2004 | Liang et al. | |
| 2004/0131537 | A1 | 7/2004 | Yang et al. | |

(Continued)

FOREIGN PATENT DOCUMENTS

| | | | | |
|---|---|---|---|---|
| JP | 04-65803 | * | 3/1992 | ............. H01C 17/24 |
| JP | 11-092176 | | 4/1999 | |

(Continued)

OTHER PUBLICATIONS

U.S. Appl. No. 11/794,910 filed on Jun. 9, 2007 (specification and drawings).

(Continued)

*Primary Examiner* — Tuan N. Quach
(74) *Attorney, Agent, or Firm* — McGinn IP Law Group, PLLC

(57) ABSTRACT

When a p-layer 4 composed of GaN is maintained at ordinary temperature and TNO is sputtered thereon by an RF magnetron sputtering method, a laminated TNO layer 5 is in an amorphous state. Then, there is included a step of thermally treating the amorphous TNO layer in a reduced-pressure atmosphere where hydrogen gas is substantially absent to thereby crystallize the TNO layer. At the sputtering, an inert gas is passed through together with oxygen gas, and volume % of the oxygen gas contained in the gas passed through is 0.10 to 0.15%. In this regard, oxygen partial pressure is $5 \times 10^{-3}$ Pa or lower. The temperature of the thermal treatment is 500° C. for about 1 hour.

20 Claims, 8 Drawing Sheets

(56) References Cited

U.S. PATENT DOCUMENTS

| | | | |
|---|---|---|---|
| 2004/0248394 A1* | 12/2004 | Kobayashi et al. | 438/609 |
| 2006/0006407 A1* | 1/2006 | Kim et al. | 257/103 |
| 2006/0046460 A1* | 3/2006 | Shu | 438/608 |
| 2006/0083150 A1* | 4/2006 | Sakaue et al. | 369/125 |
| 2007/0287025 A1* | 12/2007 | Furubayashi et al. | 428/640 |
| 2008/0035908 A1* | 2/2008 | Sakai | 257/13 |
| 2008/0128718 A1* | 6/2008 | Sumitani | 257/89 |
| 2009/0001407 A1 | 1/2009 | Osawa et al. | |
| 2009/0008672 A1 | 1/2009 | Osawa et al. | |
| 2010/0075176 A1 | 3/2010 | Yamada et al. | |
| 2010/0163886 A1 | 7/2010 | Fukunaga et al. | |

FOREIGN PATENT DOCUMENTS

| | | |
|---|---|---|
| JP | 2006-66362 | 3/2006 |
| JP | 2007-220970 | 8/2007 |
| JP | 2007-220972 A | 8/2007 |
| JP | 2007-258445 A | 10/2007 |
| JP | 2007-281497 A | 10/2007 |
| WO | WO 2008/114620 A1 | 9/2008 |

OTHER PUBLICATIONS

Chambers et al., "Epitaxial Growth and Properties of Ferromagnetic Co-doped TiO2 Anatase", Applied Physics Letters, 79, No. 21, Nov. 19, 2001, 3467-3469.

Furubayashi et al., "A Transparent Metal: Nb-doped Anatase TiO2", Applied Physics Letters, 86, 2005, 252101-3.

Matsumoto et al., "Room-Temperature Ferromagnetism in Transparent Transition Metal-doped Titanium Dioxide", Science 291, 2001, p. 854-856.

Office Action dated Nov. 8, 2010 (U.S. Appl. No. 11/794,910).

Japanese Office Action dated Jul. 12, 2012 with an English translation thereof.

Japanese Notification of Reasons for Refusal dated Dec. 10, 2012 with an English translation thereof.

* cited by examiner

METHOD FOR PRODUCING TRANSPARENT CONDUCTIVE LAYER COMPRISING TIO2 AND METHOD FOR PRODUCING SEMICONDUCTOR LIGHT-EMITTING ELEMENT UTILIZING SAID METHOD FOR PRODUCING TRANSPARENT CONDUCTIVE LAYER

BACKGROUND OF THE INVENTION

1. Field of the Invention

The present invention relates to a method for producing a transparent conductive layer comprising $TiO_2$, which can be utilized for a Group III nitride-based compound semiconductor light-emitting element.

2. Background of the Invention

ITO (Indium Thin Oxide) has been used as a transparent electrode (transparent conductive layer) of the Group III nitride-based compound semiconductor light-emitting element to be utilized as a semiconductor light-emitting element. However, since indium contained in ITO is a rare metal, indium is a cause of increasing the cost of the transparent electrode and, as a result, the cost of the light-emitting element.

Thus, it is investigated to use Nb-doped $TiO_2$ ("TNO" in the specification) as a transparent electrode. TNO has an advantage that a refractive index of TNO is higher than ITO and thus improvement in light extraction efficiency from the light-emitting element can be expected.

As documents intruding technologies relating to the invention, see Patent Documents 1 and 2.

Patent Document 1: JP-A-2006-66362
Patent Document 2: JP-A-2007-220970

It is well known that there are two main crystalline structures of $TiO_2$. These are an anatase type (metastable phase) and a rutile type (stable phase), the anatase type is considered to be advantageous for obtaining a high conductivity.

According to the investigation of the present inventors, when a $TiO_2$ layer is deposited by a sputtering method at a high temperature on a GaN surface of in a Group III nitride-based compound semiconductor light-emitting element, the $TiO_2$ layer tends to become the rutile type, so that it is effective to use a method that an amorphous $TiO_2$ layer deposited at low temperature is subjected to thermal treatment to cause crystallization into the anatase type. Moreover, a highly conductive film can be obtained by performing the thermal treatment in a reductive atmosphere containing hydrogen. However, when such thermal treatment is performed, an activation rate of Mg acceptors in a p-GaN layer decreases and power efficiency as a light-emitting element is influenced.

As a result of extensive studies for solving the problems, the present inventors have conceived the present invention. Namely, a first aspect of the invention is defined as follows.

A method for producing a transparent conductive layer comprising $TiO_2$ on a Group III nitride-based compound semiconductor layer, which comprises a deposition step of depositing an amorphous $TiO_2$ layer on the Group III nitride-based compound semiconductor layer and a thermal treatment step of thermally treating the amorphous $TiO_2$ layer in an atmosphere where hydrogen gas is substantially absent to thereby crystallize the $TiO_2$ layer.

SUMMARY OF THE INVENTION

According to the first aspect defined as above, in a state where properties of a Group III nitride-based compound semiconductor are maintained, a $TiO_2$ layer having a good anatase-type crystalline structure can be formed on the Group III nitride-based compound semiconductor layer.

By adding one or more dopants selected from the group consisting of Nb, Ta, Mo, As, Sb, Al and W to $TiO_2$, conductivity is secured for the $TiO_2$ layer and light transparency is also secured. (See a second aspect). As the dopant, it is particularly preferable to select Nb.

The Group III nitride-based compound semiconductor element refers to a light-emitting element having a light-emitting layer comprising the Group III nitride-based compound semiconductor. Here, the Group III nitride-based compound semiconductor is represented by a four-element system of $Al_XGa_YIn_{1-X-Y}N$ ($0 \leq X \leq 1$, $0 \leq Y \leq 1$, $0 \leq X+Y \leq 1$) and includes a so-called two-element system of AlN, GaN and InN and a so-called three-element system of $Al_XGa_{1-X}N$, $Al_XIn_{1-X}N$ and $Ga_XIn_{1-X}N$ ($0<X<1$). At least a part of Group III elements may be substituted by boron (B), thallium (Tl) and/or the like and at least a part of nitrogen (N) can be substituted by phosphorus (P), arsenic (As), antimony (Sb), bismuth (Bi) and/or the like. The Group III nitride-based compound semiconductor layer may contain any dopant. As an n-type impurity, Si, Ge, Se, Te, C or the like can be used. As a p-type impurity, Mg, Zn, Be, Ca, Sr, Ba, or the like can be used.

The Group III nitride-based compound semiconductor layer can be formed through a well-known metal organic vapor phase deposition method (MOCVD method), a molecular beam epitaxy method (MBE method), a halide vapor phase epitaxy method (HVPE method), a sputtering method, an ion plating method, or the like.

In this connection, after doping with a p-type impurity, it is also possible to expose the Group III nitride-based compound semiconductor to irradiation with electron beam, irradiation with plasma, or heat.

By laminating such Group III nitride-based compound semiconductor, the light-emitting element is constituted. As a layer constitution for light emission, a quantum well structure (a multi-quantum well structure or a single-quantum well structure) can be adopted. In addition, a single-hetero-type, a double hetero-type, or a home-junction-type can be also adopted.

PREFERRED EMBODIMENTS OF THE INVENTION

Figure 1:
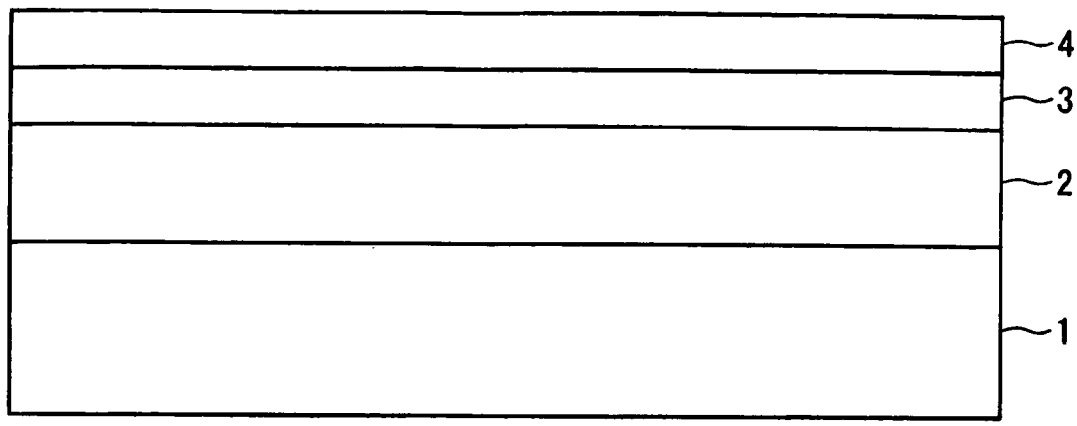
FIG. 1 shows a semiconductor laminate structure of a Group III nitride-based compound semiconductor light-emitting element.

The following will explain each step of the invention with reference to TNO as an example.

(Step of Forming Amorphous TNO)

In order to laminate an amorphous TNO layer on the Group III nitride-based compound semiconductor layer, as explained in Examples of the invention, it is sufficient to perform sputtering in a state where the Group III nitride-based compound semiconductor layer as a substrate is maintained at low temperature (around room temperature).

As the sputtering method, a known sputtering method such as a magnetron sputtering method, an RF sputtering method, a DC sputtering method, an ECR (Electron Cyclotron Resonance) sputtering method, and a combination thereof can be used. From the viewpoint of properties of the light-emitting element, a method which reduces damage on the semiconductor layer as far as possible is more preferred. Moreover, as a target material, it is possible to use an oxide target containing a dopant material and, in addition, it is also possible to use a metal target comprising Ti and a dopant.

In this connection, as a method for forming the amorphous TNO layer after film deposition, a substrate may be actively cooled to a temperature equal to or lower than room temperature. By appropriately controlling sputtering electric power, conditions where the amorphous phase is easily formed can be achieved.

The film thickness of the amorphous TNO film is desirably 100 to 1000 nm but it is possible to apply film thickness out of the range, depending on the conductivity and transmittance of the TNO layer.

(Thermal Treatment Step)

The properties of the Group III nitride-based compound semiconductor layer, which is a substrate of the TNO layer, are maintained by performing the thermal treatment of the amorphous $TiO_2$ layer in an atmosphere where hydrogen gas is substantially absent. In general, it is known that diffusion of hydrogen atoms in a material extremely rapidly occurs. Since the TNO layer is amorphous, there is a possibility that the diffusion of hydrogen atoms more rapidly occurs and the hydrogen atoms easily pass through the TNO layer. Therefore, when the thermal treatment is performed in the presence of hydrogen gas, the hydrogen gas also influences the Group III nitride-based compound semiconductor layer. In particular, in the case where the Group III nitride-based compound semiconductor layer has been transformed into p-type one, when the thermal treatment is performed in the presence of hydrogen, the activation rate of acceptor of the p-type semiconductor layer decreases and the contact resistance of the TNO electrode and the resistance of the p-type layer itself increase.

The temperature of the thermal treatment is 400° C. to 800° C. When the temperature of the thermal treatment is lower than 400° C., the TNO layer is not sufficiently crystallized. On the other hand, when the temperature of the thermal treatment exceeds 800° C., the TNO layer tends to become a rutile type, so that the resistance cannot be sufficiently lowered and the underlying nitride semiconductor layer is also damaged. Further preferred temperature of the thermal treatment is 500° C. to 750° C. The thermal treatment time can be arbitrarily selected depending on the film thickness of TNO and the temperature of the thermal treatment.

The TNO layer crystallized by such thermal treatment shows sufficient conductivity and light transmittance as a transparent electrode of a semiconductor element. In addition, properties of a substrate comprising the Group III nitride-based compound semiconductor are maintained.

According to the investigation of the present inventors, in the formation step of the amorphous TNO, when a minute amount of oxygen gas is passed through together with an inert gas at magnetron sputtering, it is found that the conductivity of the TNO layer is further improved.

In this case, the flow ratio of the oxygen gas to a carrier gas (oxygen gas/(oxygen gas+carrier gas)) is preferably 0.05 to 0.20% by volume. Thereby, conductivity increases as compared with the case where oxygen is not supplied.

On this occasion, base pressure in the chamber is sufficiently lowered to make the influence of an out gas from the chamber wall negligible as compared with the oxygen gas to be passed through. In the case where the base pressure is bad and the influence of the out gas cannot be negligible, it is sufficient to appropriately regulate the ratio of gases to be passed in depending thereon.

Since the crystallized TNO layer is physically and chemically very stable, the processing thereof is time-consuming one. Thus, it is preferable that after patterning is done to the amorphous TNO layer by etching, the TNO layer is subjected to the thermal treatment to be crystallized. The method for the processing can be arbitrarily selected. When the TNO layer is used as a transparent electrode for semiconductor light-emitting elements, it is preferable to pattern it by a wet-etching method. Of course, it is possible to pattern the TNO layer in the amorphous state by a dry-etching method.

The following will explain examples of the Group III nitride-based compound semiconductor utilizing the TNO layer of the invention.

FIG. 1 shows a fundamental semiconductor laminate structure of a Group III nitride-based compound semiconductor light-emitting element.

On a sapphire substrate 1 having a thickness of about 300 μm, an n-type Group III nitride-based compound semiconductor layer (sometimes referred to as "n-layer" in Drawings and the following description of the Specification) 2 is laminated while intervening a buffer layer comprising AlN, if necessary. The n-layer 2 possesses a contact layer comprising n-GaN and a clad layer formed by multiple lamination of InGaN/n-GaN.

An active layer 3 is laminated on the n-layer 2. The active layer 3 has a multi-quantum well structure formed by multiple laminations of AlGaN and InGaN.

On the active layer 3, a p-type Group III nitride-based compound semiconductor layer (sometimes referred to as "p-layer" in Drawings and the following description of the Specification) 4 is formed. The p-layer 4 possesses a clad layer formed by multiple laminations of InGaN/AlGaN and a contact layer comprising p-GaN.

The respective semiconductor layers 2 to 4 are laminated on the sapphire substrate 1 by a usual MOCVD method. Of course, the constitutions of the substrate material and the semiconductor layers are not limited thereto.

The semiconductor laminate structure body shown in FIG. 1 is taken out of the MOCVD apparatus and is thermally treated at 700° C. in the atmosphere, in order to promote the activation of the p-type layer. Thereafter, the structure body is set on the reactor of a versatile RF magnetron sputtering apparatus. At sputtering, oxygen gas is mixed into Ar gas as a carrier gas to achieve a flow ratio (oxygen gas/(oxygen gas+ Ar gas)) of 0.125% by volume. Then, a TNO layer 5 is formed on the p-layer 4 at ordinary temperature (see FIG. 2). The film thickness is 200 nm. The TNO layer 5 on this occasion is in an amorphous state.

Figure 2:
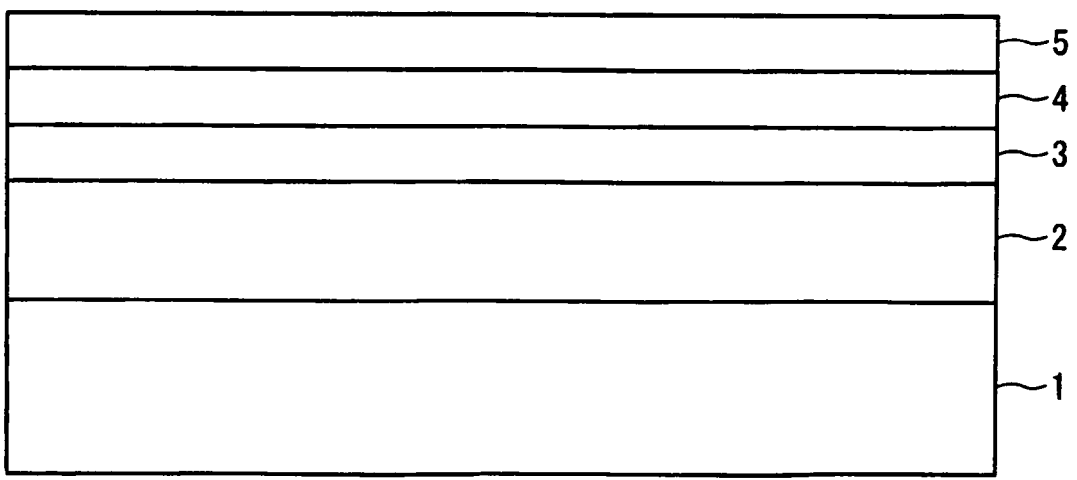
FIG. 2 shows a laminated state where an amorphous TNO layer is laminated on the p-layer of the semiconductor laminate structure of FIG. 1.
Figure 3:
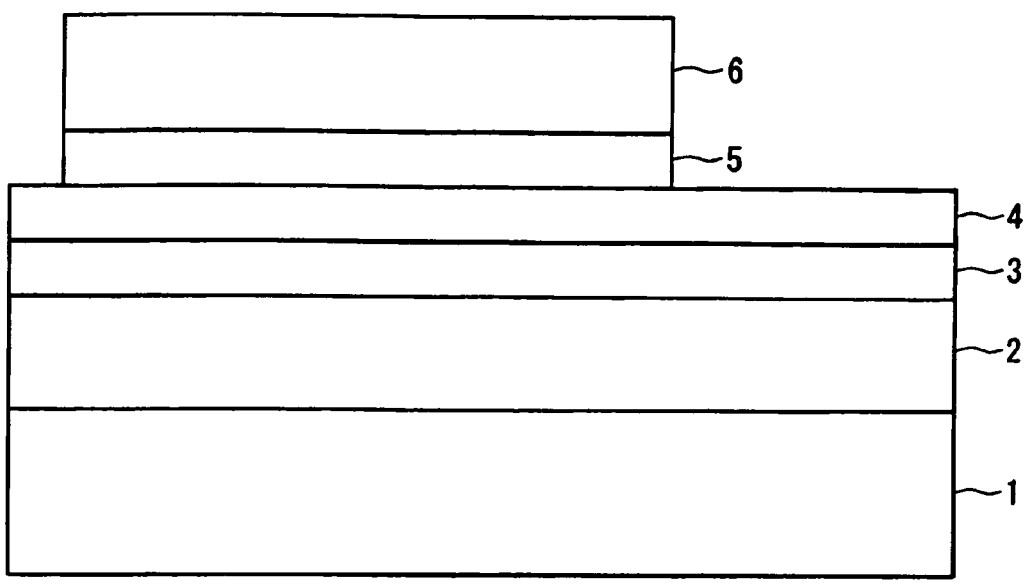
FIG. 3 shows a patterned amorphous TNO layer.

The laminate structure body of FIG. 2 is taken out of the chamber of the sputtering apparatus, a resist layer 6 is patterned, and the TNO layer 5 is subjected to wet etching with an aqueous HF solution (see FIG. 3).

Then, the laminate structure body from which the resist layer 6 is removed is set on a lamp-heating apparatus and is subjected to thermal treatment. The thermal treatment conditions are as follows: the pressure of inside of the heating furnace of the lamp-heating apparatus is reduced to achieve a state where hydrogen gas is substantially not present, and the heating time is 1 hour at a temperature of 500° C.

Figure 4:
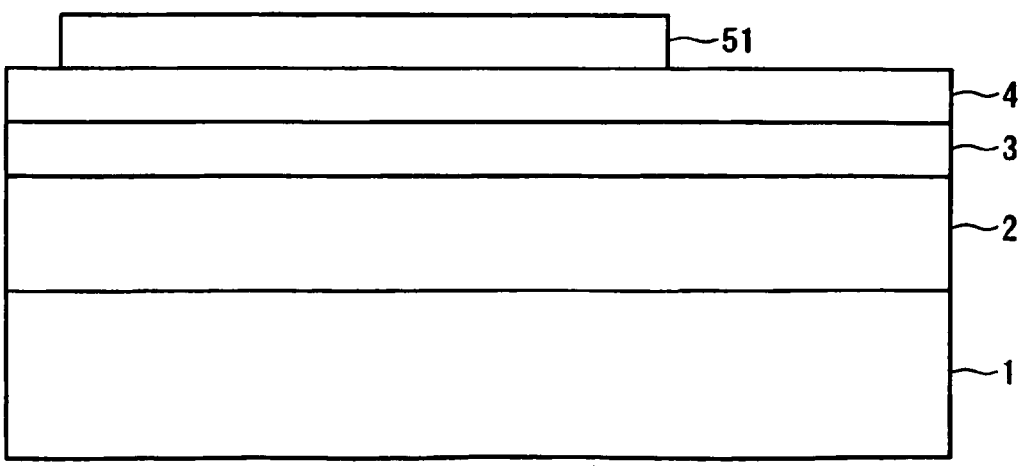
FIG. 4 shows a crystallized TNO layer.

Thereby, the TNO layer 5 in an amorphous state is crystallized. In FIG. 4, the reference number 51 represents the crystallized TNO layer.

Then, parts of the p-layer 4, the active layer 3 and the n-layer 2 are etched to partially expose the n-layer 2.

A p-pad electrode 7 is formed on the TNO layer 51. The p-pad electrode 7 is formed by sequentially depositing Ni\Al from the TNO layer 5 side. Moreover, an n-pad electrode 8 is formed on the exposed n-layer 2. The n-pad electrode 8 is formed by sequentially depositing V\Al from the n-layer 2 side. In order to stabilize the properties of the pad electrodes, thermal treatment was performed.

Figure 5:
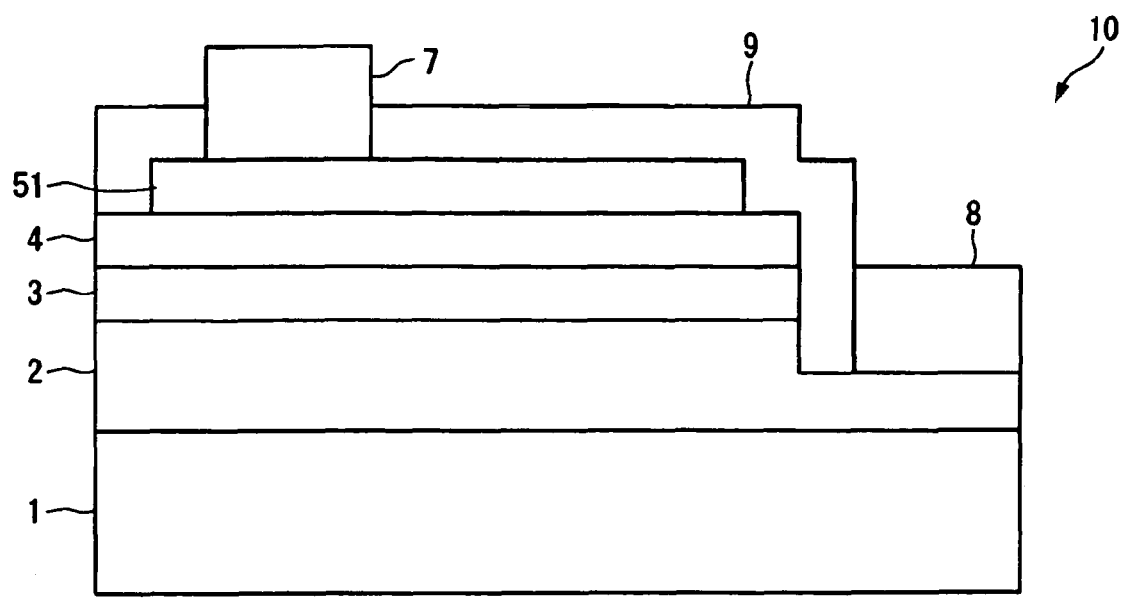
FIG. 5 shows a whole constitution of a Group III nitride-based compound semiconductor light-emitting element possessing a TNO layer.

Thereafter, in a state where the pad electrodes 7 and 8 are exposed, the surface of the laminate is coated with a protective film 9 comprising $SiO_2$ (see FIG. 5).

Then, the sapphire substrate 1 is divided to form individual Group III nitride-based compound semiconductor light-emitting elements 10.

Figure 6:
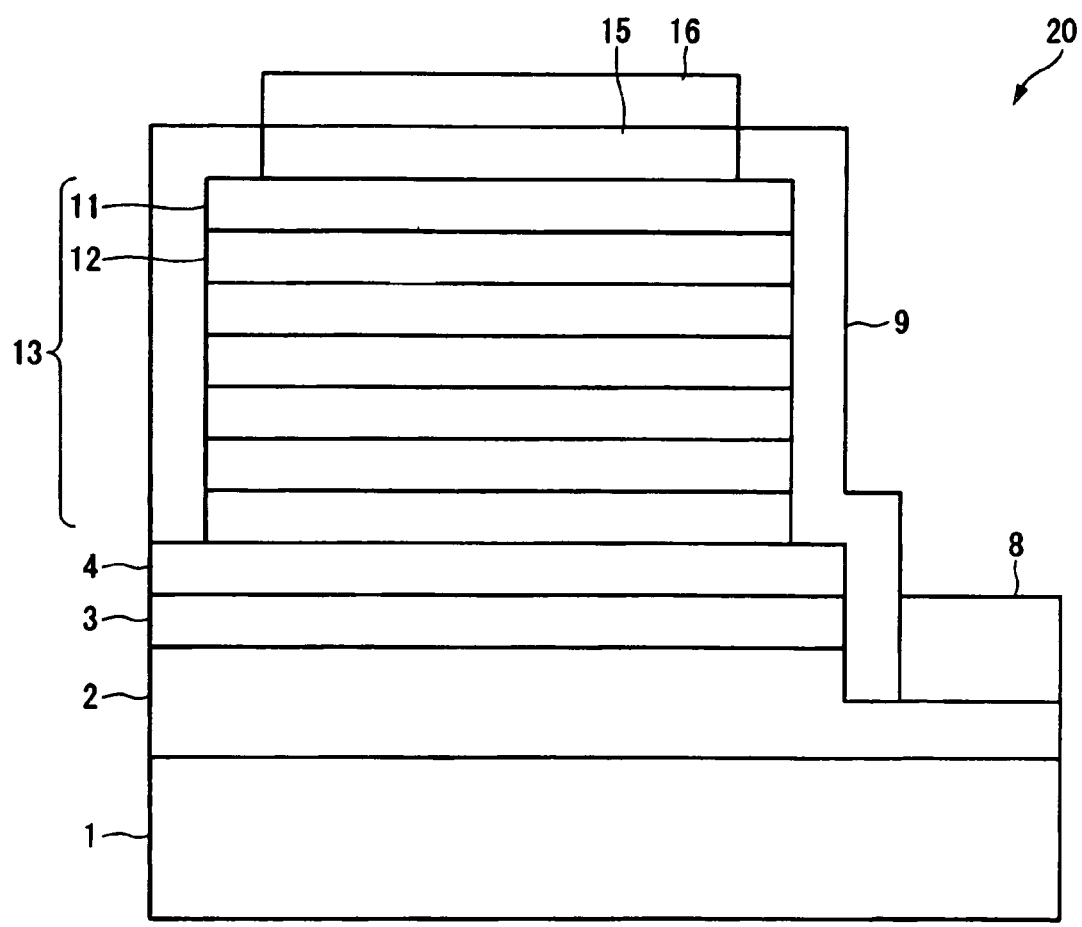
FIG. 6 also shows a Group III nitride-based compound semiconductor light-emitting element of another embodiment.

FIG. 6 shows the structure of the Group III nitride-based compound semiconductor light-emitting element 20 of the other embodiment. In this connection, the same referential numerals are attached to the same elements as in FIG. 5 and the explanation thereof is partially omitted.

The example of FIG. 6 has a structure where a transparent conductive layer 13 (total film thickness: 810 nm, total film thickness of TNO: 350 nm, total film thickness of AZO: 460 nm) comprising a multiple laminate structure of TNO11/AZO12 (Al-doped ZnO) is adopted and a metal reflective film (film thickness: 200 nm) 15 is laminated on the whole surface of top layer of the transparent conductive layer 13. The numeral 16 designates the p-pad electrode. The light-emitting element 20 shown in FIG. 6 is a flip-chip type one.

Here, the TNO/AZO transparent conductive layer 13 is formed as follows. To the p-layer 4 in an ordinary-temperature state, a TNO/AZO layer is formed by an RF magnetron sputtering method. TNO on this occasion is in an amorphous state. The laminate is taken out of the reactor of the sputtering apparatus, a resister layer is patterned and TNO/AZO is subjected to wet etching with an aqueous HF solution. The etching may be performed, by dry etching.

Then, the laminate is set on a lamp heating apparatus and is thermally treated as above. Namely, the pressure of inside of the heating furnace of the lamp-heating apparatus is reduced to achieve a state where hydrogen gas is substantially not present, and the thermal treatment conditions are as follows: the heating time is 1 hour at a temperature of 500° C. Thereby, TNO/AZO in an amorphous state is crystallized.

EXAMPLES

The following will explain Examples of the invention.

Figure 7:
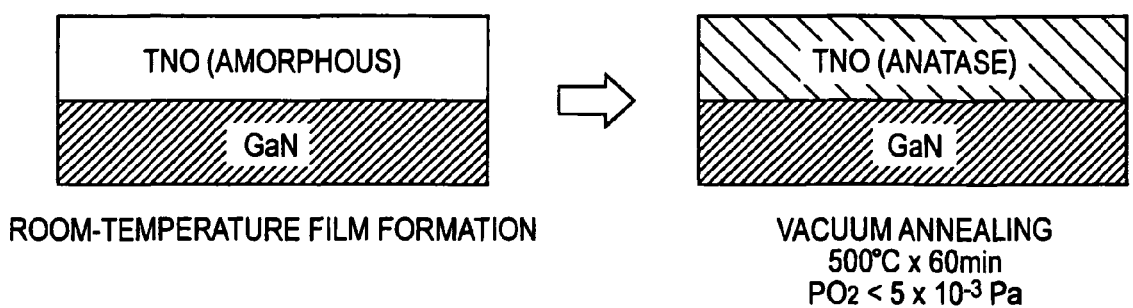
FIG. 7 is a schematic illustration showing a method for producing the TNO film of Example.

As shown in FIG. 7, a substrate (thickness: 200 μm) obtained by growing an I-GaN-layer on a sapphire substrate by MOCVD was set on a sputtering apparatus and a TNO layer (thickness: 460 nm) was deposited by an RF magnetron sputtering method while maintaining an ordinary-temperature state. Target was 2" $TiO_2$—$Nb_2O_5$ (Nb: 6 at %) and sputtering electric power was 100 W (RF), gas pressure was 0.8 Pa, and distance between the target and the substrate was 75 mm. Oxygen gas and Ar gas were supplied into the reaction apparatus in various flow ratios (% by volume, oxygen gas/(oxygen+Ar gas), the same shall apply in Drawings and the following Specification)

Thereafter, while maintaining the state where the substrate was set on the sputtering apparatus, the pressure of the inside of the chamber of the sputtering apparatus was reduced. The heating temperature was 500° C. and the heating time was 1 hour.

Figure 8:
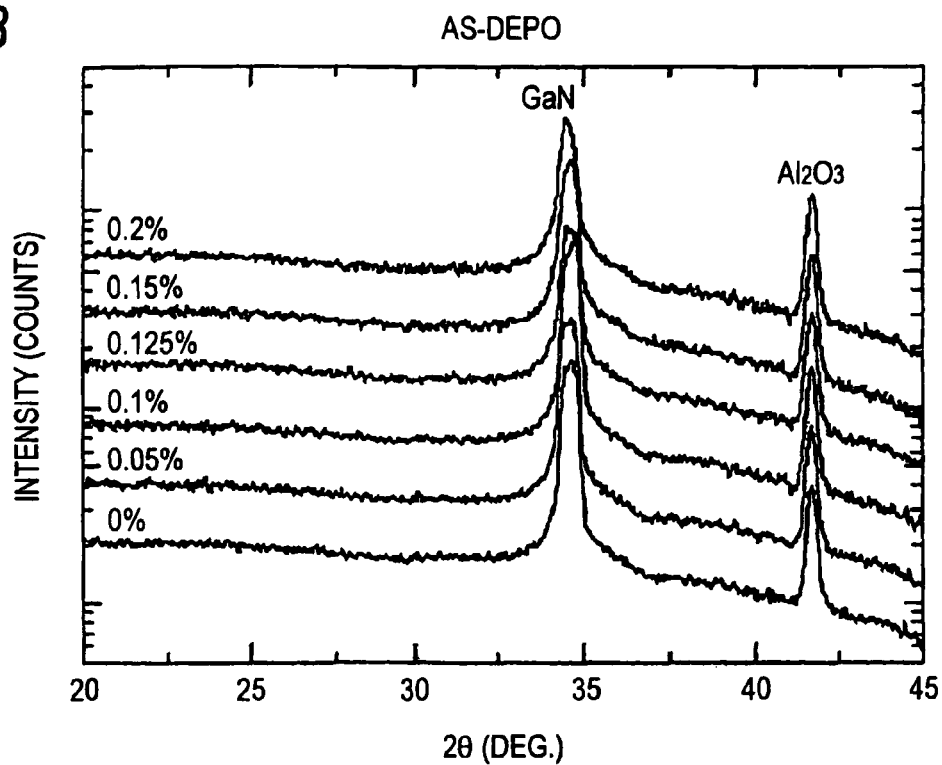
FIG. 8 is a chart showing results of X-ray diffraction analysis of the TNO film in as deposited state.

FIG. 8 shows results of X-ray diffraction analysis of the TNO layer formed by sputtering on the i-GaN substrate at ordinary temperature. In the results of FIG. 8, only peaks of sapphire and GaN were detected and thus it was found that all the TNO layers formed by sputtering on the substrate at ordinary temperature were in an amorphous state.

Figure 9:
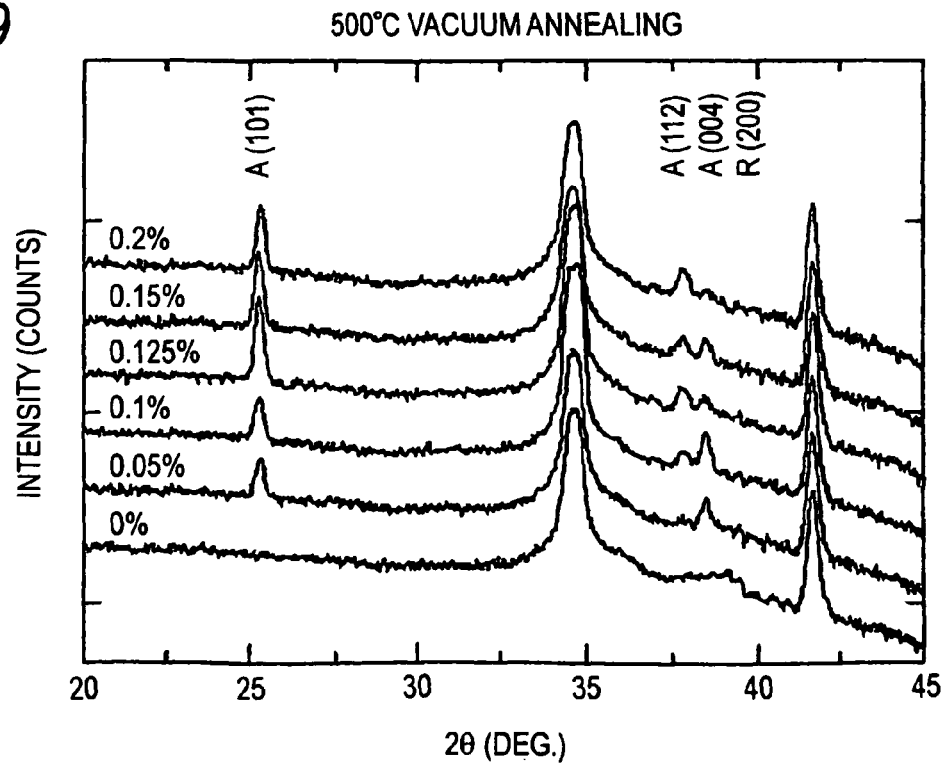
FIG. 9 is a chart showing results of X-ray diffraction analysis of the TNO film after thermal treatment.

FIG. 9 shows results of X-ray diffraction analysis of the TNO layer after thermal treatment. From the results of FIG. 9, when the flow ratio of oxygen gas at sputtering is 0% or 0.05%, it was found that the crystalline structure of TNO was a mixed phase of the anatase-type and the rutile-type. Moreover, when the flow ratio of oxygen gas is 0.10% or more, it was found that the crystalline structure became a poly-crystalline anatase monophase. The crystallinity of the TNO layer is most improved at a flow ratio of oxygen gas of 0.125% to 0.15%.

Figure 10:
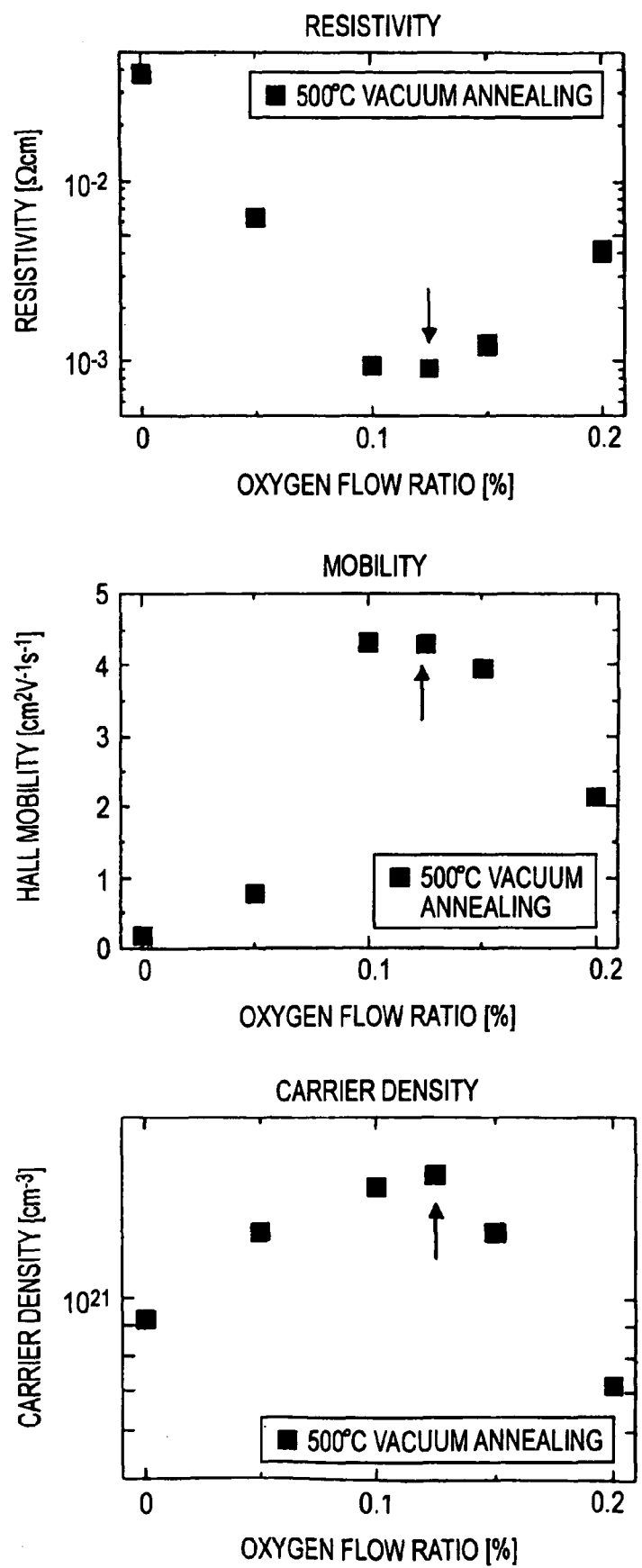
FIG. 10 is graphs showing relations between physical properties (resistivity, carrier density, mobility) of the TNO film after thermal treatment and the oxygen gas flow ratio in the sputtering gas.

FIG. 10 shows physical properties of the TNO layer after the thermal treatment. From the results of FIG. 10, the resistivity of the TNO layer decreases with increasing the oxygen gas flow rate but the resistivity turns to an upward trend at around 0.15%.

From the results of FIG. 9 and FIG. 10, it is found that the oxygen gas flow ratio is preferably 0.05 to 0.20% and more preferably 0.10 to 0.15%.

Figure 11:
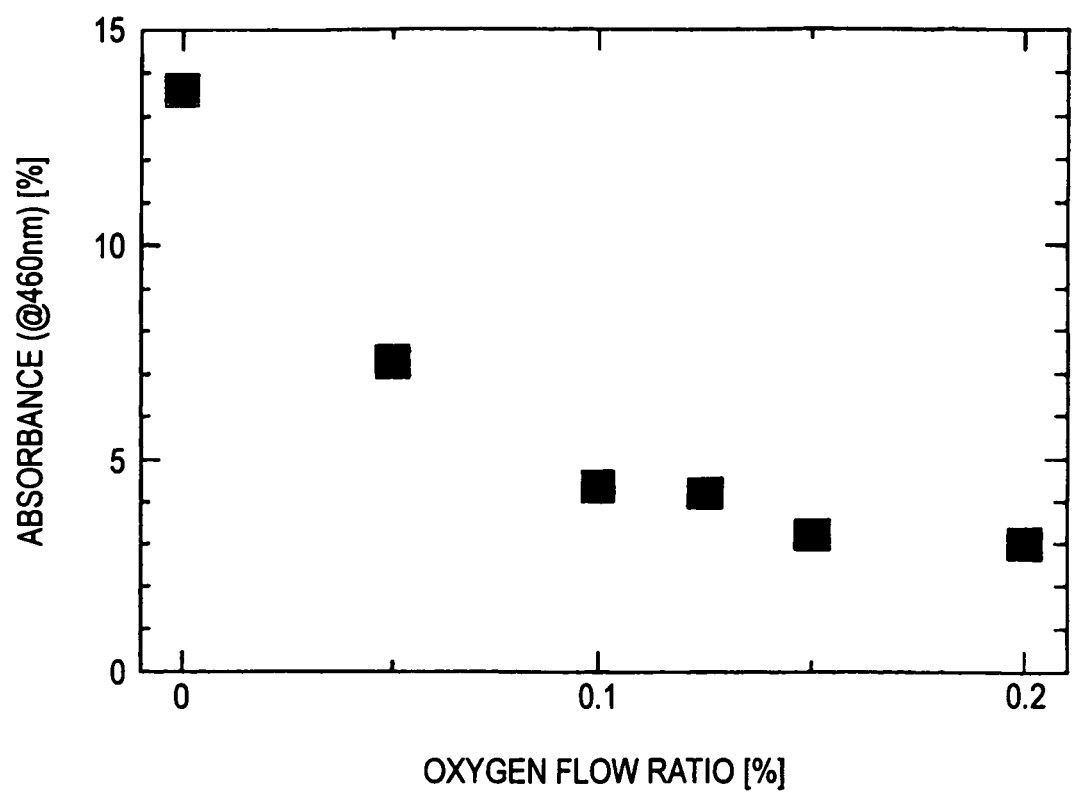
FIG. 11 is a relation between the oxygen flow ratio in the sputtering gas and light absorbance of the TNO layer after the thermal treatment.

FIG. 11 shows a relation between the oxygen flow ratio and light absorbance of the TNO layer after the thermal treatment. From the results of FIG. 11, when the oxygen flow ratio is 0.10% or more, it is found that the light absorbance was stabilized at a low level. In this connection, the light absorbance of the substrate alone is about 1% or less.

Even out of the range, for example, even at an oxygen flow ratio of 0% or 2%, it is possible to use the resulting TNO layer (polycrystalline film) as a conductive electrode of a light-emitting element and it is also possible to use the GaN-layer at that time as a p-layer of a semiconductor light-emitting element.

In the Examples, Nb-doped $TiO_2$ is referred to but a dopant other than Nb may be composed of any of Ta, Mo, As, Sb, Al, and W or a combination thereof. When any of these dopants is used, the improvement of electric conductivity can be achieved with maintaining transparency.

The present invention is not limited to the embodiments of the invention and the explanations of Examples. Various modified embodiments are also included in the invention within the range that does not depart from the description of Claims and can be easily conceived by those skilled in the art.

What is claimed is:

1. A method for producing a transparent conductive electrode comprising $TiO_2$ contacting with a p-type Group III nitride-based compound semiconductor layer, the method comprising:

laminating an amorphous $TiO_2$ layer on the p-type Group III nitride-based compound semiconductor layer, said laminating being performed by a sputtering method and without heating; and thermally treating the amorphous $TiO_2$ layer at 400° C. to 800° C. to crystallize the amorphous $TiO_2$ layer and form an anatase $TiO_2$ layer, wherein said sputtering method comprises passing through a gas including oxygen and an inert gas, and wherein the p-type Group III nitride-based compound semiconductor layer is cooled to a temperature equal to or lower than a room temperature for laminating the amorphous $TiO_2$ layer after a film deposition of the amorphous $TiO_2$ layer.

2. The method according to claim 1, wherein the anatase $TiO_2$ layer is doped with one or more elements selected from the group consisting of Nb, Ta, Mo, As, Sb, Al, and W.

3. The method according to claim 1, wherein the laminating of the amorphous $TiO_2$ layer is performed in the inert gas passed through together with the oxygen, and a ratio of the oxygen in the gas passed through is 0.05 to 0.20% by volume.

4. The method according to claim 3, wherein the ratio of the oxygen in the gas passed through is 0.10% to 0.15% by volume.

5. The method according to claim 1, further comprising: patterning the amorphous $TiO_2$.

6. The method according to claim 1, further comprising: laminating the Group III nitride-based compound semiconductor layer on a substrate.

7. The method according to claim 6, further comprising: forming a buffer layer that comprises AlN on the substrate, and laminating an n-type Group III nitride-based compound semiconductor layer on the buffer layer.

8. The method according to claim 7, wherein the n-type Group III nitride-based compound semiconductor layer comprises a contact layer comprising n-GaN and a clad layer formed by multiple laminations of InGaN and GaN.

9. The method according to claim 7, further comprising: laminating an active layer on the n-type Group III nitride-based compound semiconductor layer.

10. The method according to claim 9, wherein the active layer comprises a multi-quantum well structure including multiple laminations of AlGaN and InGaN.

11. The method according to claim 9, further comprising: laminating a p-type Group III nitride-based compound semiconductor layer on the active layer.

12. The method according to claim 11, wherein the p-type Group III nitride-based compound semiconductor layer comprises a clad layer formed by multiple laminations of InGaN and AlGaN and a contact layer comprising p-GaN.

13. The method according to claim 11, further comprising: thermally treating a laminate structure comprising the n-type Group III nitride-based compound semiconductor layer, the active layer, and the p-type Group III nitride-based compound semiconductor layer, prior to said thermally treating the amorphous $TiO_2$ layer.

14. The method according to claim 13, further comprising: sputtering the laminate structure prior to said thermally treating the anatase $TiO_2$ layer.

15. The method according to claim 13, wherein, in the sputtering method, the oxygen is mixed into the inert gas as a carrier gas.

16. The method according to claim 11, further comprising: etching parts of the n-type Group III nitride-based compound semiconductor layer, the active layer, and the p-type Group III nitride-based compound semiconductor layer to partially expose the n-type Group III nitride-based compound semiconductor layer.

17. The method according to claim 11, further comprising: forming a p-pad electrode on the anatase $TiO_2$ layer; and forming an n-pad electrode on an exposed portion of the n-type Group III nitride-based compound semiconductor layer.

18. The method according to claim 1, further comprising laminating a ZnO layer that is doped with Al, the anatase $TiO_2$ layer being doped with Nb.

19. The method according to claim 1, wherein the ratio of the oxygen in the gas passed through is in a range from 0.125% to 0.15% by volume.

20. The method according to claim 1, wherein, in said sputtering method, the gas is passed through a chamber, and wherein a base pressure in the chamber is lowered when the oxygen is passed through the chamber.

* * * * *